United States Patent
Asada

(10) Patent No.: US 7,379,285 B2
(45) Date of Patent: May 27, 2008

(54) APPARATUS FOR DRIVING INDUCTIVE LOAD

(75) Inventor: Tadatoshi Asada, Anjo (JP)

(73) Assignee: Denso Corporation, Kariya (JP)

( * ) Notice: Subject to any disclaimer, the term of this patent is extended or adjusted under 35 U.S.C. 154(b) by 103 days.

(21) Appl. No.: 11/261,628

(22) Filed: Oct. 31, 2005

(65) Prior Publication Data
US 2006/0120002 A1 Jun. 8, 2006

(30) Foreign Application Priority Data
Dec. 7, 2004 (JP) .............................. 2004-353732

(51) Int. Cl.
H02H 5/04 (2006.01)
(52) U.S. Cl. ...................... 361/103; 361/25; 361/93.8
(58) Field of Classification Search ................ 361/103, 361/25, 93.8
See application file for complete search history.

(56) References Cited

U.S. PATENT DOCUMENTS

| | | | |
|---|---|---|---|
| 5,627,411 A * | 5/1997 | Bochenek | 307/10.1 |
| 6,161,069 A * | 12/2000 | Fujita | 701/41 |
| 6,191,625 B1 | 2/2001 | Wachter et al. | |
| 6,605,853 B2 | 8/2003 | Imai et al. | |
| 6,628,491 B1 * | 9/2003 | Tihanyi et al. | 361/93.8 |
| 6,981,480 B2 * | 1/2006 | Oleksiewicz | 123/142.5 E |
| 2002/0113617 A1 * | 8/2002 | Gergintschw et al. | 326/32 |
| 2005/0264971 A1 * | 12/2005 | Morino | 361/103 |

FOREIGN PATENT DOCUMENTS

| | | |
|---|---|---|
| DE | 103 12 009 B3 | 4/2004 |
| DE | 103 02 811 A1 | 8/2004 |
| JP | A-7-67389 | 3/1995 |
| JP | A-2002-43521 | 2/2002 |
| WO | WO 2004/068710 A2 | 8/2004 |

* cited by examiner

Primary Examiner—Michael Sherry
Assistant Examiner—Christopher J Clark
(74) Attorney, Agent, or Firm—Oliff & Berridge, PLC

(57) ABSTRACT

An apparatus is disclosed that drives an inductive load according to a control signal from an external controller transmits temperature data to it for indicating a condition of the inductive load through a line driver. The external controller regenerates the control signal according to the temperature data. According to the control signal, the apparatus operates a pair of power supply circuits to complementarily supply power to the load. Thermal conditions of the power supply circuits and the line driver are monitored for detecting an overheat condition. The transmission of temperature data to the external controller is enabled as long as no overheat condition is detected in both of the power supply circuits and line driver. If an overheat condition is detected in at least one of the power supply circuits and line driver, heat protection is performed and the overheat condition is communicated to the external controller.

11 Claims, 4 Drawing Sheets

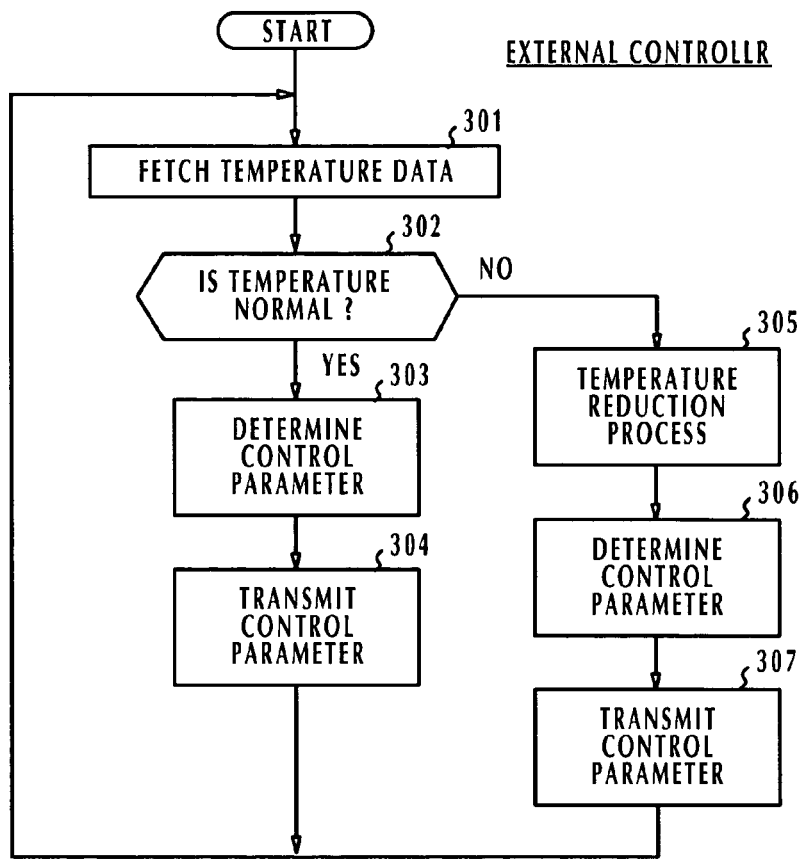
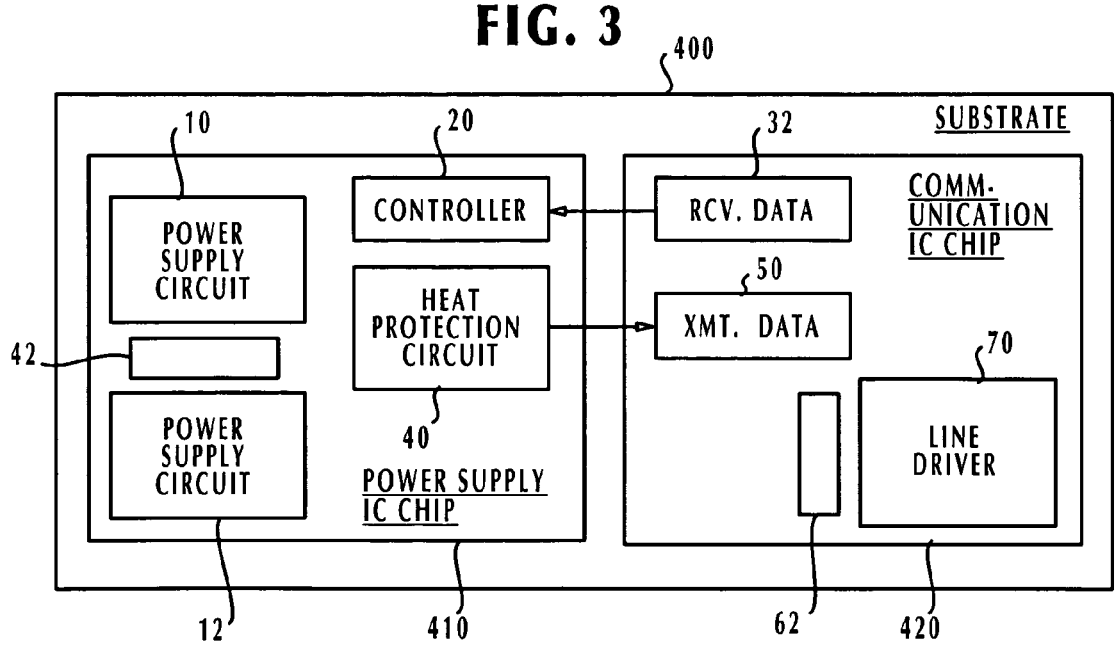

APPARATUS FOR DRIVING INDUCTIVE LOAD

CROSS-REFERENCE TO RELATED APPLICATION

This application is based on Japanese Patent Applications No. 2004-353732, filed Dec. 7, 2004, which is incorporated herein by reference.

BACKGROUND OF THE INVENTION

1. Field of the Invention

The present invention relates to an apparatus for driving an inductive load according to an instruction from an external controller.

2. Description of the Related Art

As disclosed in Japanese Patent No. 3482948, it is known that, in an apparatus that drives an inductive load such as solenoid, a heat protection arrangement is provided to prevent its power supply circuit from being overheated when the operation of the load deviates from a normal condition. In the disclosed apparatus, the power supply circuit consists of a number of output stages that are thermally decoupled from each other and a heat protection circuit is provided for each output stage.

According to another technique as disclosed in Japanese Patent Publication 7-67389, an external controller is used to control the inductive load driving apparatus when the external controller is communicated from the apparatus that the power supply circuit of the apparatus is being overheated.

In the aforesaid Japanese Patent, heat protection circuits are provided one-to-one correspondence to each output stage. Therefore, if use is made of a pair of power supply circuits that operate complementarily to each other to drive an inductive load, it would be necessary to provide a heat protection circuit to each of the complementarily operating power supply circuits. This arrangement results in a complex configuration. Further, if thermal coupling should exist between these power supply circuits, their heat protection circuits are likely to operate differently from each other, causing an error signal to be transmitted to the external controller.

SUMMARY OF THE INVENTION

It is therefore an object of the present invention to provide an inductive load driving apparatus that is simple in configuration, yet reliable in communicating a thermally abnormal state of the apparatus to an external controller.

According to the present invention, there is provided an apparatus for driving an inductive load according to an external controller, comprising a pair of power supply circuits for complementarily supplying power to the inductive load in response to the control signal, a first heat protection circuit that monitors the operating temperature of said pair of power supply circuits and performs heat protection on said power supply circuits when an overheat condition of the power supply circuits is detected, a line driver that sends a signal to said external controller when said overheat condition is detected by said first heat protection circuit, and a second heat protection circuit, thermally decoupled from said power supply circuits, that monitors the operating temperature of said line driver and performs heat protection on said line driver when an overheat condition of the line driver is detected.

Preferably, the power supply circuits and the second heat protection circuit are formed on a common substrate of SOI (silicon on insulator) structure and separated from each other by an insulating film. With this arrangement, the power supply circuits and the heat protection circuit of the line driver are less thermally affected from each other.

In order to further reduce the thermal interference between the power supply circuits and the heat protection circuit of the line driver, it is preferable that the second heat protection circuit is formed in an area adjacent to the line driver but remote from the power supply circuits, so that the line driver and the power supply circuits are located in positions not oppositely facing each other.

Preferably, the normal operating current of the line driver is set at a value equal to $\frac{1}{100}$ of the maximum normal operating current of the power supply circuits. With this setting, a temperature difference of approximately 20° C. can be maintained between the heat generated by the power supply circuits and the heat generated by the line driver and the abnormal thermal condition of the power supply circuits can be reliably transmitted to the external controller.

Preferably, the first heat protection circuit is configured to perform heat protection when the heat generated by the power supply circuits exceeds a first threshold temperature lower than a second threshold temperature established for the second heat protection circuit to perform heat protection on the line driver. With this difference threshold setting, normal operation of the line driver can be maintained even when the power supply circuits are generating excessive heat. Hence reliability is ensured for the power supply circuits to transmit their abnormal thermal condition to the external controller.

Preferably, the power supply circuits, the line driver, and the first and second heat protection circuits are formed on a same integrated circuit chip, and the power supply circuits and the line driver are separated from each other. With this arrangement, the operating thermal characteristics of the first heat protection circuit faithfully reflect the actual temperature of the power supply circuits and likewise, the operating thermal characteristics of the second heat protection circuit faithfully reflect the actual temperature of the line driver. As a result, the threshold temperature difference between the two heat protection circuits can be easily maintained and their degree of precision can be improved.

Preferably, the power supply circuits are constructed of semiconductor devices that are different in type from the semiconductor devices of which the line driver is constructed. The use of different semiconductor types serves to enhance the effect of the threshold temperature difference between the two heat protection circuits.

Preferably, the apparatus further comprises a heat sink for dissipating the heat generated by the power supply circuits, the heat sink being thermally coupled to the housing of an actuator that operates with the inductive load. By the provision of the heat sink, it is possible to further communicate an excessive heat condition caused by an overloaded condition of the actuator.

Furthermore, it is preferable that the heat sink is cooled off by the liquid that is used to cool the inductive load or an actuator that operates with it. Cooling the heat sink with liquid serves to improve the heat dissipation characteristic of the heat sink and allows communication of abnormal conditions to the external controller, such as abnormally high ambient temperature and abnormal condition of the cooling system.

According to a second aspect, the present invention provides an apparatus for driving an inductive load according to a control signal supplied from an external controller, comprising a pair of power supply circuits for complementarily supplying power to said inductive load in response to said control signal, a first heat protection circuit that monitors the operating temperature of said pair of power supply circuits and performs heat protection on said power supply circuits when an overheat condition of the power supply circuits is detected, a second heat protection circuit, thermally decoupled from said power supply circuits, that monitors the operating temperature of said line driver and performs heat protection on said line driver when an overheat condition of the line driver is detected, and a line driver that transmits temperature data to said external controller when no overheat condition is detected by both of said first and second heat protection circuits and transmits an alarm signal to said external controller if said overheat condition is detected by at least one of said first and second heat protection circuits.

According to a third aspect, the present invention provides a heat protection method for an apparatus that drives an inductive load according to a control signal from an external controller and transmits data to the external controller indicating a condition of the inductive load through a line driver, the external controller generating the control signal according to the data from the apparatus, comprising the steps of (a) complementarily operating a pair of power supply circuits to supply power to the inductive load according to the control signal, (b) monitoring temperature of the pair of power supply circuits and the line driver for detecting an overheat condition in at least one of the pair of power supply circuits and the line driver, (c) transmitting the data to the external controller if no overheat condition is detected in both of the power supply circuits and in the line driver, and (d) performing heat protection on at least one of the pair of power supply circuits and the line driver if the overheat condition is detected and communicating the overheat condition to the external controller to thereby allow the external controller to reflect the communicated overheat condition in the control signal.

Preferably, heat protection is performed on the pair of power supply circuits when the monitored temperature of the power supply circuits exceeds a first threshold value, and heat protection is performed on the line driver when the monitored temperature of the line driver exceeds a second threshold value higher than the first threshold value.

BRIEF DESCRIPTION OF THE DRAWINGS

The present invention will be described in detail with reference to the following drawings, in which:

FIG. 2 is a flowchart of the operation of an external controller;

FIG. 3 is a top plan view of the inductive load driving apparatus;

DETAILED DESCRIPTION

Figure 1:
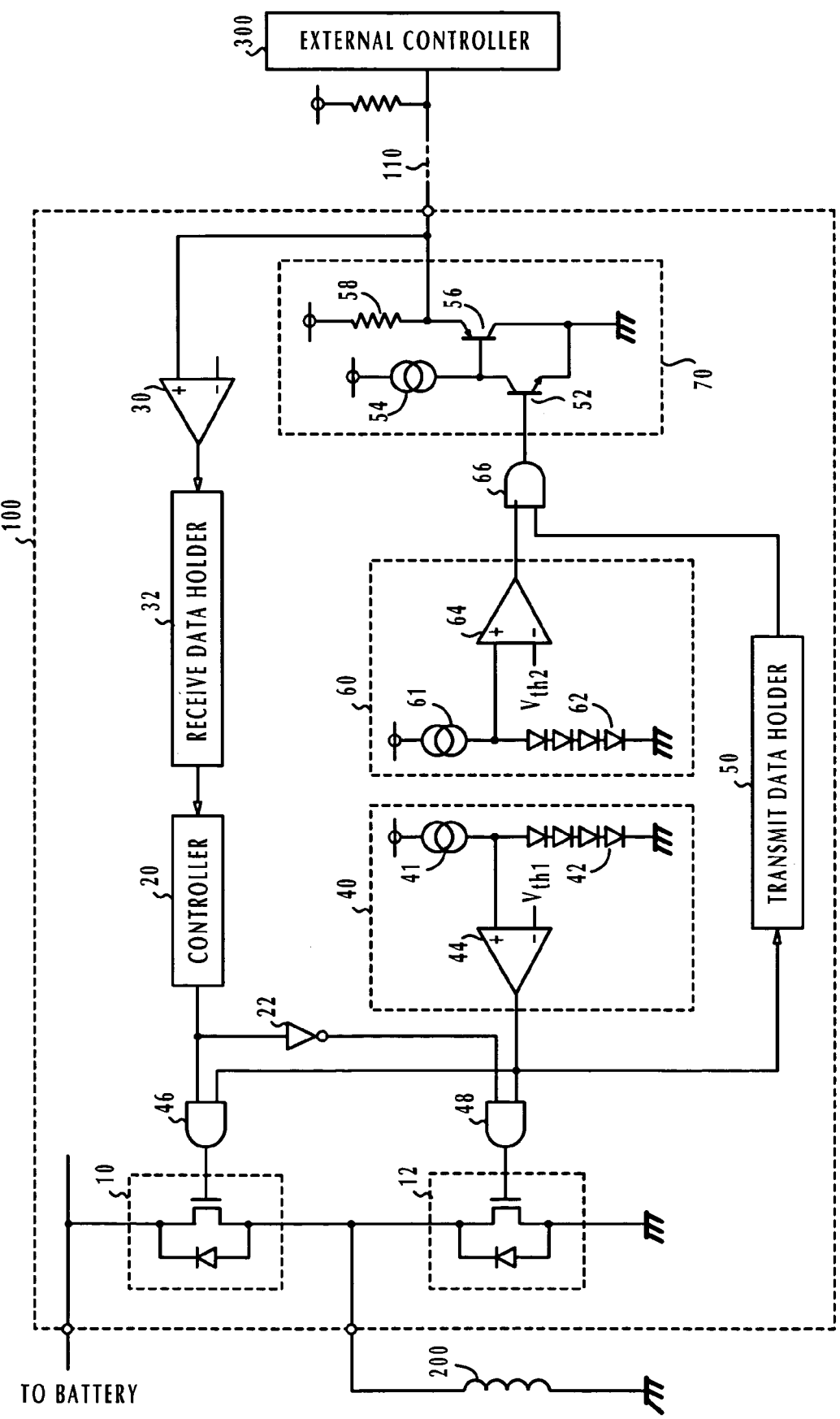
FIG. 1 is a circuit diagram of an inductive load driving apparatus of the present invention.

In FIG. 1, there is shown an apparatus 100 constructed according to a preferred embodiment of the present invention for driving an inductive load 200. Apparatus 100, which is usually mounted on a motor vehicle, is connected to an external controller 300 via a communication link 110 to receive control data through a line receiver 30 and transmit control data through a line driver 70. The data transmitted from the external controller 300 is detected by the line receiver 30 and stored in a receive data holder 32 and supplied to a control circuit 20.

Connected in series between a battery (not shown) and ground is a pair of power supply circuits 10, 12, each of which is a parallel circuit of a field-effect transistor (or power MOSFET) and a diode, with the circuit node between them being connected to the inductive load 200. Power supply circuits 10, 12 operate with a logic circuit that is formed with AND gates 46, 48 and inverter 22 to perform complementary ON-OFF power control on the inductive load 200 in response to an output signal from the control circuit 20. As will be described later in detail, the power supply circuits 10, 12 are formed in respective areas that are close to each other. A first heat protection circuit 40 is provided, which is formed with a constant current source 41, a diode array 42 and a comparator 44. Diode array 42 is formed in an area between the power supply circuits 10 and 12 as a heat sensing element to detect the operating temperature of the power supply circuits. Diode array 42 is connected in series with the constant current source 41 to develop a voltage representing the detected temperature at the circuit node between the diode array 42 and the constant current source 41. This voltage is compared by the comparator 44 with a threshold voltage $V_{th1}$ which corresponds to a threshold temperature at which the first heat protection circuit 40 performs heat protection on the power supply circuits 10, 12. Since it is known that the forward voltage of a diode varies inversely with temperature, the forward voltage of diode array 42 drops when the operating temperature of the power supply circuits 10, 12 increases. Threshold voltage $V_{th1}$ is equal to a forward voltage of the diode array 42 at which the operating temperature of the power supply circuits 10, 12 becomes higher than the threshold temperature of the heat protection circuit 40.

The output of comparator 44 is connected to the AND gates 46 and 48 and further to a transmit data holder 50.

The output of transmit data holder 50 is connected to the first input of an AND gate 66 that feeds the line driver 70.

When the heat generated by the power supply circuits 10 and 12 is lower than the threshold temperature, the forward voltage of diode array 42 is higher than the threshold voltage $V_{th1}$ and the comparator 44 produces a high level output. This high level output is supplied to the transmit data holder 50 to enable the AND gate 66. Further, the high level output of comparator 44 is used to enable the AND gates 46 and 48 to allow the complementary binary values of the output of controller 20 to be respectively supplied to the inputs of power supply circuits 10 and 12.

As a result, when the output of controller 20 is high, the power supply circuit 10 is turned on, and the power supply circuit 12 is turned off. When the output of controller 20 switches to low level, the situation is reversed so that the power supply circuit 10 is turned off and the power supply circuit 12 is turned on. In this way, the inductive load 200 is driven by the complementarily conducting states of power supply circuits 10 and 12 as long as the output of comparator 44 is high.

When excessive heat is generated by the power supply circuits 10 and 12 and the temperature sensed by the diode array 42 exceeds the threshold temperature, the forward voltage of diode array 42 becomes lower than the threshold voltage $V_{th1}$ and the comparator 44 changes its output state from high voltage to low voltage. Thus, the AND gates 46 and 48 are inhibited, producing a low level voltage at the inputs of power supply circuits 10, 12. In this way, the DC power from the battery to the inductive load 200 is turned off as long as the output of comparator 44 is low.

The low level output of comparator 44 is then stored in the transmit data holder 50 and delivered to the AND gate 66.

Line driver 70 comprises a NPN transistor 52 and an PNP transistor 56. Transistor 52 has its base connected to the output of AND gate 66 and its collector-emitter path connected between a constant current source 54 and ground. Transistor 56 has its base connected to the collector of transistor 52 and its emitter-collector path connected between a pull-up resistor 58 and ground, with its emitter being connected to the communication link 110.

A second heat protection circuit 60 is provided, which is formed with a constant current source 61, a diode array 62 and a comparator 64 whose output is connected to the second input of AND gate 66. Diode array 62 is formed in an area adjacent to the line driver 70 as a heat sensing element to detect its operating temperature. The forward biasing voltage of the diode array 62 drops when the operating temperature of the line driver 70 increases. Diode array 62 is connected in series with the constant current source 61 to develop a voltage representing the detected operating temperature of the line driver 70 at the circuit node between it and the constant current source 61. This voltage is compared by the comparator 64 with a threshold voltage $V_{th2}$ which corresponds to a threshold temperature at which the second heat protection circuit 60 performs heat protection on the line driver 70. Since the forward voltage of diode array 62 decreases with an increase in operating temperature of the line driver 70, the threshold voltage $V_{th2}$ is set equal to a forward voltage of the diode array 62 at which the operating temperature of the line driver 70 becomes higher than the threshold temperature of heat protection circuit 60.

When the heat generated by the line driver 70 is lower than the threshold temperature, the comparator 64 produces a high level output, which enables the AND gate 66 to allow the output of transmit data holder 50 to be supplied to the base of transistor 52. Therefore, as long as the line driver 70 is operating normally, the data stored in the transmit data holder 50 is supplied to the line driver 70 and the transistors 52 and 56 are both turned on, causing a low-level signal to be transmitted to the external controller 300.

When the heat generated by the line driver 70 exceeds the threshold temperature of heat protection circuit 60, the forward voltage of diode array 62 drops below the threshold voltage $V_{th2}$, and the comparator 64 changes its output state from high voltage to low voltage, which disables the AND gate 66, producing a low level voltage at the base of transistor 52. As a result, the transistors 52 and 56 are turned off, causing a high level output to be transmitted to the external controller 300.

Therefore, when the power supply circuits 10, 12 and the line driver 70 are operating normally, the AND gate 66 is enabled to pass data stored in the transmit data holder 50 via the line driver 70 to the external controller 300 as temperature data indicating that the power supply circuits 10, 12 are operating normally.

When the power supply circuits 10, 12 are excessively heated while the line driver 70 is operating normally, the first heat protection circuit 40 performs heat protection on the power supply circuits 10, 12 and stores data in the transmit data holder 50 indicating that the power supply circuits 10, 12 are excessively heated. This data is passed through the AND gate 66 to the line driver 70 and transmitted to the external controller 300 as temperature data.

If the line driver 70 is excessively heated, the second heat protection circuit 60 detects this condition and performs heat protection. When this occurs, the AND gate 66 is disabled, resulting in the line driver 70 setting its output at high voltage level.

It is preferable that the threshold voltage $V_{th1}$ is higher than the threshold voltage $V_{th2}$. Assume that both of the power supply circuits 10, 12 and line driver 70 equally rise in temperature, the forward voltage of diode array 42 becomes lower than the higher threshold voltage $V_{th1}$ earlier than the forward voltage of diode array 62 becomes lower than the lower threshold voltage $V_{th2}$. As a result, the first heat protection circuit 40 performs heat protection on the power supply circuits 10, 12 earlier than the second heat protection circuit 60 does on the line driver 70. With this differential threshold setting, normal operation of the line driver 70 can be maintained even when heat protection is being performed on the power supply circuits 10, 12. Hence reliability is ensured for the power supply circuits to communicate their abnormal state to the external controller.

If the upper limit of the operating temperature of line driver 70 is higher than the upper limit of the operating temperature of the power supply circuits 10, 12, the effect of the differential threshold setting can be enhanced and reliably achieved. For this reason, it is preferable that the power supply circuits 10, 12 are made up of semiconductor devices that are different in type from the semiconductor devices of the line driver 70. The illustrated embodiment shows that unipolar transistors are used for power supply circuits 10, 12 and bipolar transistors for line driver 70.

In a preferred embodiment, the normal drive current of transistor 56 of the line driver 70 is set equal to 1/100 of the maximum normal drive current of the power supply circuits 10, 12. With this setting, the power dissipation of transistor 56 is 1/100 of the power dissipation of power supply circuits 10,12 and a temperature difference of about 20° C. can be secured between power supply circuits 10, 12 and the line driver 70. This guarantees stability to the operation of comparators 44 and 64 even if their offset voltage is 10 mV and ensures reliability for transmitting the abnormal thermal condition of the power supply circuits 10, 12 to the external controller 300 via the line driver 70.

The operation of the external controller 300 proceeds according to the flowchart shown in FIG. 2. When the external controller 300 begins operation at step 301, it fetches data from the apparatus 100 as temperature data. This temperature data is either a low voltage signal that was stored in the transmit data memory 50 and received when the power supply circuits 10, 12 were operating normally, or a high voltage signal that was received either when overheat condition was detected by the first heat protection circuit 40 and stored in the transmit data memory 50 or when overheat condition was detected by the second heat protection circuit 60. The fetching of the temperature data may be performed by transmitting a request signal from the external controller 300 to the apparatus 100 in a request-response mode or by transmitting a request signal at known intervals.

At step 302, the external controller 300 examines the fetched temperature data and determines whether or not the operating temperatures of power supply circuits 10, 12 and line driver 70 are normal.

If the fetched temperature data indicates that the operating temperatures of both power supply circuits 10, 12 and line driver 70 are normal, the external controller 300 proceeds to step 303 to determine a control parameter for normal operation and transmits the control parameter to the inductive load driving apparatus 100 (step 304), and returns to the starting point of the routine. The control parameter may be in the form of a duty ratio of the power supply circuits 10, 12. If the inductive load 200 is a vehicle's alternator the control parameter may be transmitted in the form of a voltage correction value for correcting the output voltage of the alternator.

If the fetched temperature data indicates that excessive heat is generated in the apparatus 100, the external controller 300 proceeds to step 305 to perform a temperature reduction process on the apparatus 100 by determining a control parameter (step 306) and transmitting the determined control parameter to the apparatus 100 (step 307), and then returns to the starting point of the routine. This control parameter indicates a low duty ratio for the power supply circuits 10, 12 or a correction value for controlling the output voltage of the vehicle's alternator.

Figure 4:
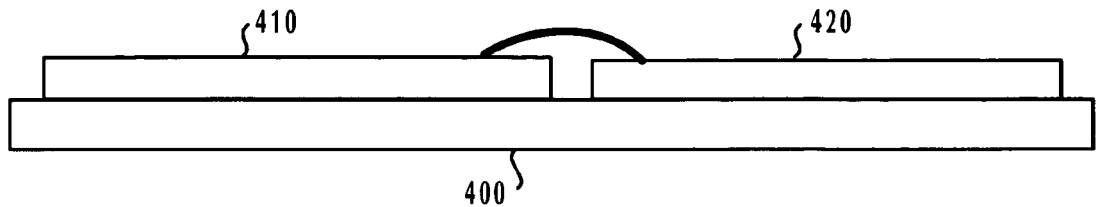
FIG. 4 is a side view of the inductive load driving apparatus, illustrating one exemplary layout of its constituents.

FIGS. 3 and 4 are a top plan view and a side view of the load driving apparatus 100, respectively. As shown in these drawings, the apparatus 100 is formed on a common semiconductor substrate 400 and includes a power supply IC chip 410 and a communication IC chip 420 physically separated from the power supply IC chip 410, so that they are thermally decoupled from each other, but physically integrated with the substrate 400. In the power supply IC chip 410, the power supply circuits 10 and 12 are formed in respective areas spaced a short distance apart from each other. Diode array 42 is created in a narrow space between the power supply circuits 10 and 12. Controller 20 and heat protection circuit 40 are mounted within the power supply IC chip 410.

Receive data holder 32 and the transmit data holder 50 are formed in the communication IC chip 420 in an area adjacent to and connected to the controller 20 and heat protection circuit 40, respectively. Line driver 70 and the diode array 62 are formed on the communication IC chip 420, with the diode array 62 being adjacent to the line driver 70. Line driver 70 is formed in an area remote from the power supply circuits 10 and 12.

Figure 5:
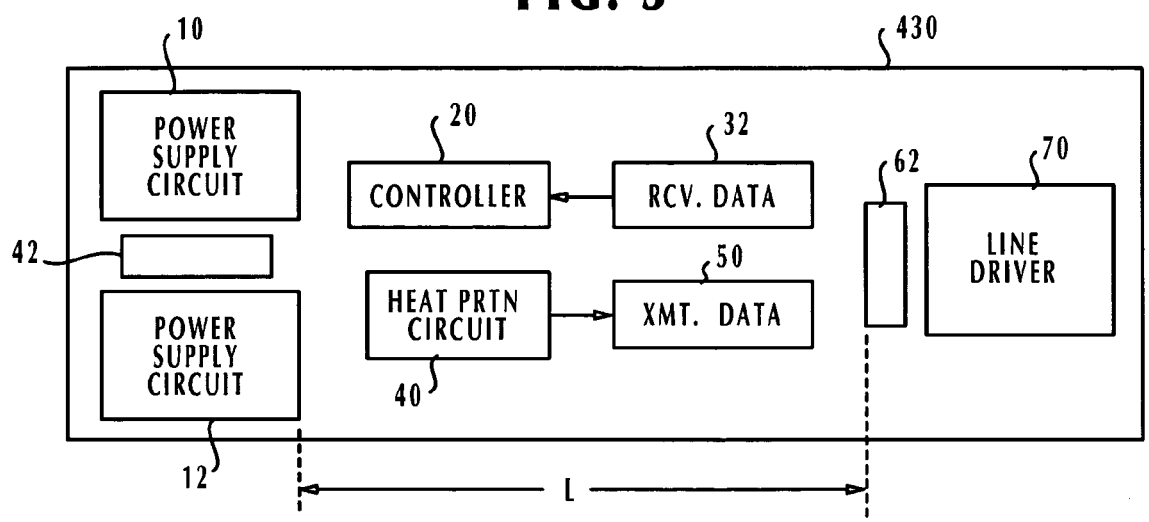
FIG. 5 is a top plan view of the inductive load driving apparatus, illustrating another exemplary layout of its constituents.

Apparatus 100 may be implemented with an IC chip that is formed on a substrate 430 of SOI (silicon on insulator) structure as shown in FIG. 5. Power supply circuits 10 and 12 are formed in an area spaced a sufficient distance L for thermal isolation from the temperature sensing diode array 62 formed in an area adjacent to the line driver 70.

Figure 6:
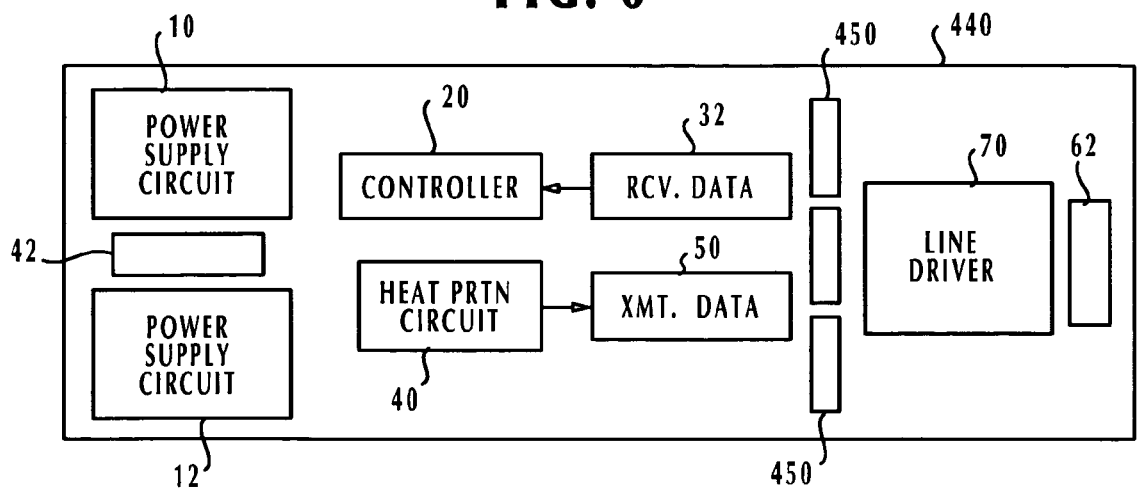
FIG. 6 is a top plan view of the inductive load driving apparatus, illustrating a further exemplary layout of its constituents.

FIG. 6 shows another layout plan of the inductive load driving apparatus 100. Apparatus 100 is implemented with an IC chip formed on an SOI substrate 440. The configuration corresponding to the power supply IC chip 410 of FIG. 3 and the configuration corresponding to the communication IC chip 420 of FIG. 3 are separated from each other by means of $SiO_2$ insulators 450. Since the $SiO_2$ insulators 450 are one-order of magnitude less in thermal conductivity than the silicon substrate, they effectively isolate the line driver 70 from the heat of power supply circuits 10, 12. In this layout, the temperature sensing diode 62 is provided in an area close to the line driver 70, but remote from the power supply circuits 10, 12.

Figure 7:
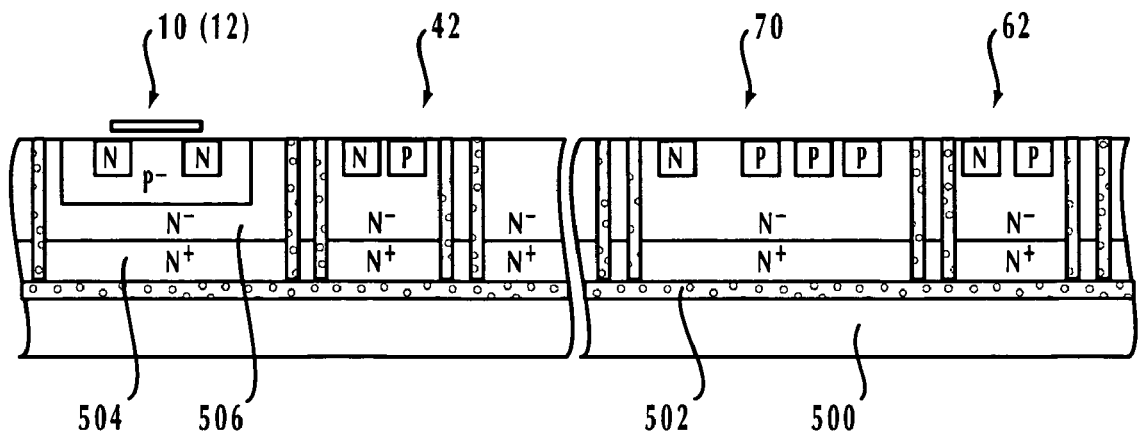
FIG. 7 is a cross-sectional view of the inductive load driving apparatus formed on an SOI substrate.

A cross-sectional view of one example of the SOI structure is shown in FIG. 7. FIG. 7 shows relative positions of the power supply circuits 10, 12, temperature sensing diodes 42 and 62 and the line driver 70, which are formed on a common substrate 500 and separated from the substrate by an insulation film 502, an $N^+$ layer 504 and an $N^-$ layer 506.

Figure 8:
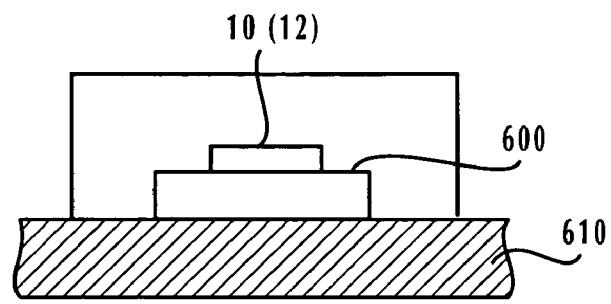
FIG. 8 is a cross-sectional view of the apparatus, illustrating a heat sink on which the apparatus is mounted.

Power supply circuits 10 and 12 are preferably mounted on a heat sink 600 as shown in FIG. 8 if they generate a large amount of heat. Heat sink 600 is secured to and thermally coupled to an actuator housing 610 that is driven by the inductive load 200. By the provision of this heat sink, it is possible to communicate an overheat condition caused by the actuator being overloaded in addition to excessively loaded condition of the power supply circuits.

Figure 9:
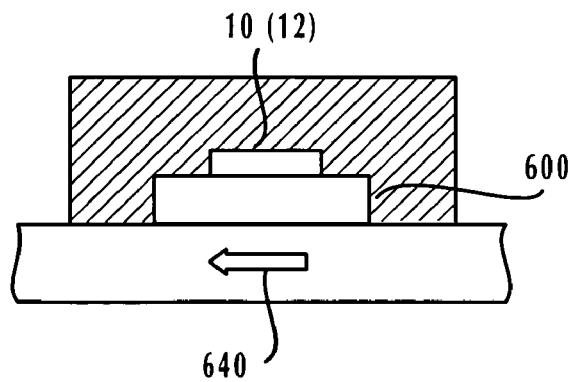
FIG. 9 is a cross-sectional view of the apparatus, illustrating a heat sink which is cooled by a liquid flow.

As shown in FIG. 9, the heat sink 600 may be cooled by a liquid flow 630 that is used to cool the inductive load 200 or the actuator driven by the load 200. Cooling the heat sink with liquid serves to improve the heat dissipation characteristic of the heat sink 600 and allows communication of abnormal conditions to the external controller 300, such as abnormally high ambient temperature and abnormal condition of the cooling system.

Since the power supply circuits, the line driver, and the first and second heat protection circuits are formed on a same integrated circuit chip, and the power supply circuits 10, 12 and the line driver 70 are separated from each other, the operating thermal characteristic of the first heat protection circuit 40 faithfully reflects the actual temperature of the power supply circuits 10, 12. Likewise, the operating thermal characteristic of the second heat protection circuit 60 faithfully reflects the actual temperature of the line driver 70. As a result, the threshold temperature difference between the two heat protection circuits 40 and 60 can be easily maintained and a high degree of precision can be guaranteed.

It is seen therefore that there is no need to provide two heat protection circuits one for each of the power supply circuits 10 and 12. Simple circuit configuration can be achieved. Since the second heat protection circuit 60 is thermally decoupled from the power supply circuits 10, 12, their excessive heat condition can be reliably communicated to the external controller 300. Further, since the second heat protection circuit 60 protects the line driver 70 from damage caused by possible overloading, high reliability is guaranteed for transmitting the abnormal thermal condition of the power supply circuits to the external controller 300.

While embodiments of the present invention are shown and described, other modifications and alterations of the present invention are apparent to those skilled in the art. For example, the diode arrays 42 and 64 may be replaced with thermal sensitive elements that vary their operating characteristics with the operating temperatures of the power supply circuits 10 and 12 and the line driver 70. The power supply circuits 10, 12 and the line driver 70 could also be constructed of combinations other than the combination of power MOSFET's and bipolar transistors. Further, if the inductive load 200 is the field coil of a vehicle's alternator, the power supply circuit 10 may be formed of a transistor and the power supply circuit 12 may be formed of a diode.

What is claimed is:

1. An apparatus for driving an inductive load according to a control signal supplied from an external controller, comprising:

a pair of power supply circuits for complementarily supplying power to the inductive load in response to said control signal;

a first heat protection circuit that monitors an operating temperature of the pair of power supply circuits, detects an overheat condition of the power supply circuits based on the monitored operating temperature, and produces, depending on the detection of the overheat condition, first data showing whether or not the power supply circuits are in the overheat condition, the first data including given data commanding heat protection to be performed on the power supply circuits;

a data holder that holds the first data produced by the first heat protection circuit;

a driver that is connected to the external controller to drive the external controller;

a second heat protection circuit, thermally decoupled from the power supply circuits, that monitors an operating temperature of the driver, detects an overheat condition of the driver based on the detected operating temperature of the driver, and produces second data commanding heat protection to be performed on the driver when the overheat condition of the driver is detected, the first and second data produced by the first and second heat protection circuits being reflected in the control signal; and a gate that allows the driver to send the first data held in the data holder to the external controller provided that the second heat protection circuit detects no overheat condition of the line driver, and allows the driver to send the second data to the external controller when the second heat protection circuit detects the overheat condition of the line driver.

2. The apparatus of claim 1, wherein the power supply circuits, the line driver, and the first and second heat protection circuits are formed on a same integrated circuit chip, and the power supply circuits and the line driver are separated from each other.

3. The apparatus of claim 2, wherein the power supply circuits and the second heat protection circuit are formed on a same SOI substrate and separated from each other by an insulating film.

4. The apparatus of claim 2, wherein the second heat protection circuit is formed in an area that is adjacent to the line driver and remote from the power supply circuits.

5. The apparatus of claim 1, wherein normal operating current of the driver is set at a value equal to 1/100 of maximum normal operating current of the power supply circuits.

6. The apparatus of claim 1, wherein the first heat protection circuit produces the first data when the operating temperature generated by the power supply circuits exceeds a first threshold temperature, and the second heat protection circuit produces the signal when the operating temperature generated by the driver exceeds a second threshold temperature higher than the first threshold temperature.

7. The apparatus of claim 6, wherein the power supply circuits comprise semiconductor devices that are different in type from semiconductor devices that form the driver.

8. The apparatus of claim 1, further comprising a heat sink for dissipating heat generated by the power supply circuits, the heat sink being thermally coupled to a housing of an actuator that operates with the inductive load.

9. The apparatus of claim 1, further comprising a heat sink for dissipating heat generated by the power supply circuits, and wherein the heat sink is cooled off by liquid that is used to cool one of the inductive load and an actuator that operates with the inductive load.

10. A heat protection method for an apparatus that comprises a pair of power supply circuits for complimentarily supplying power to an inductive load according to a control signal from an external controller and transmits information to the external controller indicating a temperature condition of the apparatus through a driver, the external controller generating the control signal according to the information from the apparatus, comprising the steps of:

a) monitoring an operating temperature of the pair of power supply circuits to detect an overheat condition of the power supply circuits based on the monitored operating temperature and to produce, depending on the detection of the overheat condition, first data showing whether or not the power supply circuits is in the overheat condition, the first data including given data commanding heat protection to be performed on the power supply circuits;

b) holding the first data produced;

c) monitoring an operating temperature of the driver to detect an overheat condition of the driver based on the detected operating temperature of the driver and to produce second data commanding heat protection to be performed on the driver when the overheat condition of the driver is detected; and d) allowing the driver to send the held first data to the external controller provided that no overheat condition of the driver is detected, while allowing the driver to send the second data to the external controller when the overheat condition of the driver is detected.

11. The method of claim 10, wherein the step (a) comprises a step of:

producing the given data when the monitored temperature of the power supply circuits exceeds a first threshold value; and the step (c) comprises a step of:

producing the second data when the monitored temperature of the driver exceeds a second threshold value higher than the first threshold value.

* * * * *